United States Patent
Sato et al.

(10) Patent No.: US 6,797,061 B2
(45) Date of Patent: Sep. 28, 2004

(54) QUARTZ GLASS CRUCIBLE FOR PULLING UP SILICON SINGLE CRYSTAL AND PRODUCTION METHOD THEREFOR

(75) Inventors: Tatsuhiro Sato, Takefu (JP); Shigeo Mizuno, Takefu (JP); Yasuo Ohama, Takefu (JP)

(73) Assignee: Shin Etsu Quartz Products Co., Ltd., Tokyo (JP)

(*) Notice: Subject to any disclaimer, the term of this patent is extended or adjusted under 35 U.S.C. 154(b) by 105 days.

(21) Appl. No.: 09/987,463

(22) Filed: Nov. 14, 2001

(65) Prior Publication Data

US 2002/0029737 A1 Mar. 14, 2002

Related U.S. Application Data

(63) Continuation of application No. 09/462,097, filed as application No. PCT/JP99/02703 on May 24, 1999, now abandoned.

(30) Foreign Application Priority Data

May 25, 1998 (JP) ........................................... 10-159880
Jan. 29, 1999 (JP) ........................................... 11-022628

(51) Int. Cl.[7] ............................................. C30B 15/10
(52) U.S. Cl. ........................ 117/208; 117/13; 117/213; 117/200; 117/900
(58) Field of Search ........................... 117/13, 213, 208, 117/200, 900

(56) References Cited

U.S. PATENT DOCUMENTS

| | | | | |
|---|---|---|---|---|
| 4,632,686 A | | 12/1986 | Brown et al. ................. 65/18.1 |
| 5,306,473 A | * | 4/1994 | Nakajima et al. ............ 422/248 |
| 5,389,582 A | * | 2/1995 | Loxley ........................... 501/4 |
| 5,885,071 A | * | 3/1999 | Watanabe et al. ........... 432/264 |
| 5,895,527 A | * | 4/1999 | Taguchi et al. .............. 117/200 |
| 5,917,103 A | * | 6/1999 | Watanabe et al. ............. 65/17.3 |
| 5,989,021 A | * | 11/1999 | Sato et al. ................... 432/264 |

FOREIGN PATENT DOCUMENTS

| | | | |
|---|---|---|---|
| DE | 236 084 A1 | | 5/1986 |
| EP | 319.031 | * | 6/1989 |
| EP | 463543 | * | 1/1992 |
| FR | 2 746 092 | | 3/1997 |
| JP | 59-50096 | | 3/1994 |
| JP | 9-20586 | * | 1/1997 |
| JP | 10-25184 | * | 1/1998 |

* cited by examiner

Primary Examiner—Robert Kunemund
(74) Attorney, Agent, or Firm—Arent Fox PLLC

(57) ABSTRACT

Provided are a quartz glass crucible for pulling up a silicon single crystal, with which not only a defectless silicon single crystal can be pulled but a single crystallization ratio can greatly be improved and a production method therefor. The quartz glass crucible comprises a crucible body constituted of a semi-transparent quartz glass layer and a transparent quartz glass layer formed on the inner wall surface of the crucible bass body and no expanded bubbles equal to ro more than 0.5 mm in diameter are present in a layer 1 mm in depth from an inner surface of the quartz glass crucible after the silicon single crystal is pulled up using the quartz glass crucible.

18 Claims, 5 Drawing Sheets

1 mm 1 mm 1 mm 1 mm

QUARTZ GLASS CRUCIBLE FOR PULLING UP SILICON SINGLE CRYSTAL AND PRODUCTION METHOD THEREFOR

This application is a continuation of application Ser. No. 09/462,097, filed Jan. 12, 2000, now abandoned, which is a 371 of PCT/JP99/02703, filed May 24, 1999.

TECHNICAL FIELD

The present invention relates to a quartz glass crucible effectively used for pulling up a silicon single crystal and a production method therefor.

BACKGROUND ART

In company with recent demands for a silicon single crystal with defects at a low level and a large diameter, high purification of quartz glass crucible for pulling up such a silicon single crystal has been desired and as raw materials therefor, a high purity synthetic quartz glass powder obtained by means of a sol-gel method, synthetic cristobalite powder or purified natural quartz powder has been employed.

A so-called arc rotation melting method has generally been adopted in production of quartz glass crucibles, wherein a raw materials as described above is supplied into a rotating mold to form a powder layer along the inner surface thereof, the powder layer is molten by heating with arc that is applied from the inside of the mold, and after melting of the powder layer the arc is ceased and the molten powder layer is left to be eventually cooled to room temperature while the mold is continued to be rotated. In production of a quartz glass crucible by means of the method, the quartz glass crucible is required to be formed with an inner surface layer having as few bubbles as possible in order to improve a single crystallization ratio of silicon crystal produced in pulling up.

However, even a quartz glass crucible thus produced has had inconvenience that in the course of pulling up a crystal or crystals using such a quartz glass crucible under a reduced pressure, the crucible is transformed in such a manner that bubbles generate and grow in the transparent layer and the inner surface comes to assume an irregular topographic feature including recesses and projections, so that a single crystallization ratio of the pulled up crystal or crystals becomes decreased.

To cope with such a problem, the present applicant has proposed a quartz glass crucible in which fine bubbles in the transparent layer are suppressed from expansion when in usage under reduced pressure by means of doping hydrogen in the transparent layer and a production method therefor (Japanese Patent Laid-open Publication No. 5-124889). The proposed production method has faults that a hydrogen atmosphere treatment furnace for the hydrogen doping becomes large in scale for treating a large size crucible, which leads to high cost, and a special safety measure is necessary to be taken for explosion of hydrogen gas due to its inflammability.

Furthermore, the present applicant has proposed a production method in which an inner surface of a crucible still in the making is cooled in a hydrogen containing atmosphere after application of the arc is ceased and thereby, there are eliminated the faults associated with the above-described production method (Japanese Patent Laid-open Publication No. 7-330358). This method, however, is not yet an established one, since it stands in need of the treatment in a hydrogen containing atmosphere and also makes an apparatus and a process more complex.

The present inventors, taking the above described circumstances into consideration, have conducted studies about behavior of fine bubbles residing in the inner surface layer of a quartz glass crucible after pulling up a silicon crystal using the quartz glass crucible. The present inventors have obtained findings that, in a silicon single crystal pulling up process, even if no bubbles are virtually recognized in a layer 1 mm deep of the inner surface of a quartz glass crucible before use in the process, bubbles 0.5 mm or more in diameter are recognized in the transparent layer when the inner surface of the quartz glass crucible is observed after it is used in a silicon single crystal pulling up process and in the case, a single crystallization ratio is low. This has been estimated because bubbles burst, chips of quartz glass generated by the burst of bubbles float on the surface of a silicon melt and move up to a silicon crystal under growth.

The present inventors have investigated into the following methods in order to find a good measure to prevent bubble generation and growth in the transparent layer of a quartz glass crucible.

(1) Quartz glass crucibles were produced while changing some of conventional heat melting conditions in the arc rotation melting method, silicon single crystals were pulled up using the quartz glass crucibles, and the transparent layers of the quartz glass crucibles after the pulling up were examined with the findings obtained that bubble expansion in the transparent layers were decreased as compared with cases of quartz glass crucibles produced by means of conventional methods.

(2) Quartz glass crucibles were produced while using quartz powder having a low gas content, a low OH group concentration and/or a fine particle size as raw materials for a transparent layer of the inner surface under the same heat melting conditions as conventional conditions in the arc rotation melting method, silicon single crystals were pulled up using the quartz glass crucibles, and the transparent layers of the quartz glass crucibles after the pulling up were examined with the findings obtained that bubble expansion in the transparent layers were decreased as compared with cases of quartz glass crucibles produced using conventional quartz powder as raw materials.

In transparent layers of the inner surfaces of quartz glass crucibles produced by means of the above described two methods (1) and (2), the maximum diameters and total sectional areas of bubbles present, and gas contents in the transparent layers of the inner surfaces of quartz glass crucibles before use were reduced, and the maximum diameters and total sectional areas of bubbles recognized in the transparent layers of the quartz glass crucibles after pulling up silicon single crystal were respectively suppressed to be equal to or less than 0.5 mm and equal to or less than 40%. Accordingly, stability of pulling up performance was found to be greatly improved, which leads to completion of the present invention.

It is an object of the present invention to provide a quartz glass crucible for pulling up a silicon single crystal, with which not only can a defectless silicon single crystal be pulled up but a single crystallization ratio can greatly be improved, and a production method therefor.

DISCLOSURE OF INVENTION

In order to achieve the object, a first aspect of a quartz glass crucible for pulling up a silicon single crystal of the present invention resides in that the quarts glass crucible comprises a crucible base body constituted of a semi-transparent quartz glass layer and a transparent quartz glass layer formed on an wall inner surface of the crucible base body, and is characterized in that no expanded bubbles equal to or more than 0.5 mm in diameter are present in a layer 1 mm in depth from an inner surface of the quartz glass crucible after the silicon single crystal is pulled up using the quartz glass crucible. It is more preferred that no expanded bubbles equal to or more than 0.3 mm are present in the layer 1 mm in depth.

A total sectional area of bubbles is preferably equal to or less than 40% and more preferably equal to or less than 20% in the layer 1 mm in depth from the inner surface of the quartz glass crucible after the silicon single crystal is pulled up using the quartz glass crucible.

A second aspect of a quartz glass crucible for pulling up a silicon single crystal of the present invention resides in that the quartz glass crucible comprises a crucible base body constituted of a semi-transparent quartz glass layer and a transparent quartz glass layer formed on an inner wall surface of the crucible base body, and is characterized in that, in the transparent quartz glass layer, the maximum of diameters of bubbles is equal to or less than 0.2 mm, a total sectional area of bubbles is equal to or less than 20% and a gas content is equal to or less than 1 $\mu$l/g. It is more preferred that, in the transparent quartz glass layer, the maximum of diameters of bubbles is equal to or less than 0.1 mm and a total sectional area of bubbles is equal to or less than 10%.

A quartz glass crucible for pulling up a silicon single crystal of the present invention is produced without hydrogen doping.

In a case where a diameter of the quartz glass crucible for pulling up a silicon single crystal is in the range of 22 to 28 inches, in an arc rotation melting method, a base body is prepared in a mold using silicon dioxide powder and an inner layer is formed on the inner surface of the base body using silicon dioxide powder under conditions that the silicon dioxide powder has a gas content equal to or less than 30 $\mu$l/g and preferably equal to or less than 20 $\mu$l/g and an OH group concentration equal to or less than 300 ppm and preferably equal to or less than 60 ppm, a heat melting power is applied in the range of 400 to 1000 kw, a horizontal distance from an arc center to a falling position of the silicon dioxide powder is in the range of 50 to 300 mm, a distance from the arc center to an inner surface of piled-up powder on the bottom is equal to or less than 800 mm and preferably equal to or less than 300 mm, a particle diameter of the silicon dioxide powder is equal to or less than 300 $\mu$m and preferably equal to or less than 200 $\mu$m, and a feed rate of the silicon dioxide powder is equal to or less than 200 g/min and preferably equal to or less than 100 g/min.

In a case where a diameter of the quartz glass crucible for pulling up a silicon single crystal is in the range of 22 to 28 inches, in an arc rotation melting method, a base body is prepared in a mold using silicon dioxide powder and an inner layer is formed on the inner surface of the base body using silicon dioxide powder under conditions that the silicon dioxide powder has a gas content equal to or less than 20 $\mu$l/g and preferably equal to or less than 10 $\mu$l/g and an OH group concentration equal to or less than 300 ppm and preferably equal to or less than 60 ppm, a heat melting power is applied in the range of 200 to 400 kw, a horizontal distance from an arc center to a falling position of the silicon dioxide powder is in the range of 50 to 300 mm, a distance from the arc center to an inner surface of piled-up powder on the bottom is equal to or less than 800 mm and preferably equal to or less than 300 mm, a particle diameter of the silicon dioxide powder is equal to or less than 300 $\mu$m and preferably equal to or less than 200 $\mu$m, and a feed rate of the silicon dioxide powder is equal to or less than 200 g/min and preferably equal to or less than 100 g/min.

In a case where a diameter of the quartz glass crucible for pulling up a silicon single crystal is in the range of 30 to 48 inches, in an arc rotation melting method, a base body is prepared in a mold using silicon dioxide powder and an inner layer is formed on the inner surface of the base body using silicon dioxide powder under conditions that the silicon dioxide powder has a gas content equal to or less than 30 $\mu$l/g and preferably equal to or less than 20 $\mu$l/g and an OH group concentration equal to or less than 300 ppm and preferably equal to or less than 60 ppm, a heat melting power is applied in the range of 600 to 2000 kw, a horizontal distance from an arc center to a falling position of the silicon dioxide powder is in the range of 50 to 300 mm, a distance from the arc center to an inner surface of piled-up powder on the bottom is equal to or less than 1500 mm and preferably equal to or less than 500 mm, a particle diameter of the silicon dioxide powder is equal to or less than 300 $\mu$tm and preferably equal to or less than 200 $\mu$m, and a feed rate of the silicon dioxide powder is equal to or less than 200 g/min and preferably equal to or less than 100 g/min.

A first aspect of a production method for a quartz glass crucible in the range of 22 to 28 inches for pulling up a silicon single crystal of the present invention is characterized in that, in an arc rotation melting method, a base body is prepared in a mold using silicon dioxide powder and an inner layer is formed on the inner surface of the base body using silicon dioxide powder under conditions that the silicon dioxide powder has a gas content equal to or less than 30 $\mu$l/g and preferably equal to or less than 20 $\mu$l/g and an OH group concentration equal to or less than 300 ppm and preferably equal to or less than 60 ppm, a heat melting power is applied in the range of 400 to 1000 kw, a horizontal distance from an arc center to a falling position of the silicon dioxide powder is in the range of 50 to 300 mm, a distance from the arc center to an inner surface of piled-up powder on the bottom is equal to or less than 800 mm and preferably equal to or less than 300 mm, a particle diameter of the silicon dioxide powder is equal to or less than 300 $\mu$m and preferably equal to or less than 200 $\mu$m, and a feed rate of the silicon dioxide powder is equal to or less than 200 g/min and preferably equal to or less than 100 g/min.

A second aspect of a production method for a quartz glass crucible in the range of 22 to 28 inches for pulling up a silicon single crystal of the present invention is characterized in that, in an arc rotation melting method, a base body is prepared in a mold using silicon dioxide powder and an inner layer is formed on the inner surface of the base body using silicon dioxide powder under conditions that the silicon dioxide powder has a gas content equal to or less than 20 $\mu$l/g and preferably equal to or less than 10 $\mu$l/g and an OH group concentration equal to or less than 300 ppm and preferably equal to or less than 60 ppm, a heat melting power is applied in the range of 200 to 400 kw, a horizontal distance from an arc center to a falling position of the silicon dioxide powder is in the range of 50 to 300 mm, a distance from the arc center to an inner surface of piled-up powder on the bottom is equal to or less than 800 mm and preferably equal to or less than 300 mm, a particle diameter of the silicon dioxide powder is equal to or less than 300 $\mu$m and preferably equal to or less than 200 $\mu$m, and a feed rate of the silicon dioxide powder is equal to or less than 200 g/min and preferably equal to or less than 100 g/min.

A production method for a quartz glass crucible in the range of 30 to 48 inches for pulling up a silicon single crystal of the present invention is characterized in that, in an arc rotation melting method, a base body is prepared in a mold using silicon dioxide powder and an inner layer is formed on the inner surface of the base body using silicon dioxide powder under conditions that the silicon dioxide powder has a gas content equal to or less than 30 μl/g and preferably equal to or less than 20 μl/g and an OH group concentration equal to or less than 300 ppm and preferably equal to or less than 60 ppm, a heat melting power is applied in the range of 600 to 2000 kw, a horizontal distance from an arc center to a falling position of the silicon dioxide powder is in the range of 50 to 300 mm, a distance from the arc center to an inner surface of piled-up powder on the bottom is equal to or less than 1500 mm and preferably equal to or less than 500 mm, a particle diameter of the silicon dioxide powder is equal to or less than 300 μm and preferably equal to or less than 200 μm, and a feed rate of the silicon dioxide powder is equal to or less than 200 g/min and preferably equal to or less than 100 g/min.

As a lower limit of a gas content of the silicon dioxide powder, 1 μl/g can be employed. Further, a lower limit of a particle diameter of the silicon dioxide powder is preferably 10 μm. Still further, a lower limit of the feed rate of the silicon dioxide powder is preferably 30 g/min.

While as silicon dioxide powder used in the present invention, either of synthetic quartz glass powder and natural quartz glass powder can be used, synthetic quartz powder is more preferably be used.

In production of a quartz glass crucible for pulling up a silicon single crystal of the present invention, the powder layers in the mold may be prepared under a normal pressure, but can also be prepared in the mold by evacuating from the outside surface of the layer (that is, the inside of the mold). In the case of preparation under a reduced pressure, the pressure is preferably of the order in the range of 10 to 700 mm Hg.

Further, a content ratio of a gas including carbon such as $CO$ and $CO_2$ in quartz glass powder that is used, as raw materials, in production of a quartz glass crucible for pulling up a silicon single crystal of the present invention is preferably equal to or less than 10%.

BEST MODE TO CARRY OUT THE INVENTION

Figure 1:
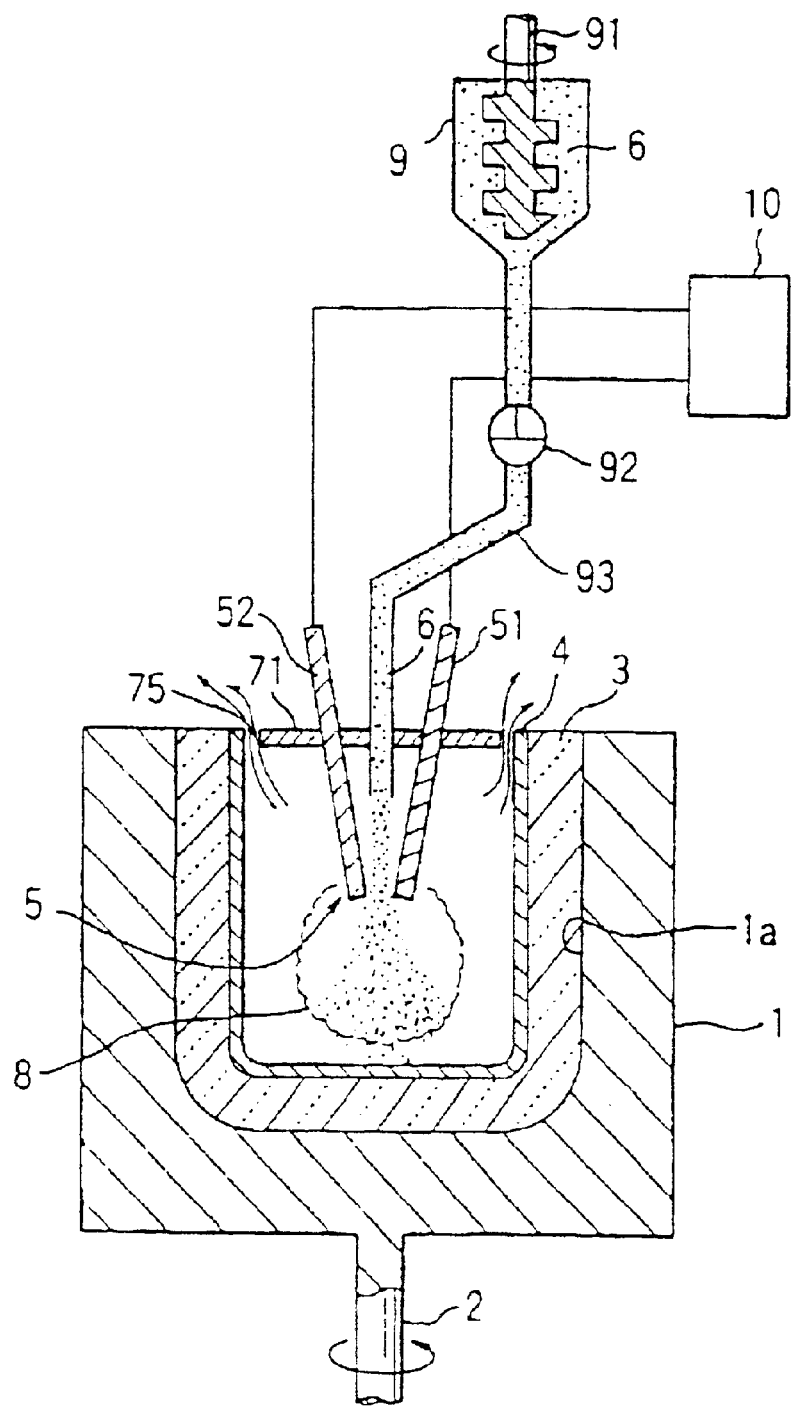
FIG. 1 is a schematic sectional view illustrating an apparatus used in carrying out a method of the present invention and a production method for a quartz glass crucible that uses the apparatus.

Hereinafter, description will be made of an embodiment of the present invention on the basis of accompanying drawings. FIG. 1 is a schematic sectional view illustrating an apparatus used in carrying out a method of the present invention and a production method for a quartz glass crucible that uses the apparatus.

In FIG. 1, a rotary mold 1 is provided with a rotary shaft 2. In the mold 1, a cavity 1a is formed and a semi-transparent quartz glass made from silicon dioxide powder, for example natural quartz powder, that is, a base body 3 of a quartz glass crucible constituting an outer layer thereof is provided.

The base body 3 is prepared by feeding the silicon dioxide powder into the mold 1 in rotation while piling up the silicon dioxide powder along the inner wall of the mold 1 to form a preform in the shape of a desired crucible, and heating the preform from the inside to melt the silicon dioxide powder therein, followed by cooling down the preform.

In order to heat the preform from the inner surface, as shown in FIG. 1, an arc discharge apparatus 5 with carbon electrodes 51 and 52 that are connected to a power supply 10 can be employed. Instead of the arc discharge apparatus, a plasma discharge apparatus may be used. The production of the base body 3 is detailed in Japanese Patent Publication No. 4-22861.

The apparatus shown in FIG. 1 is provided with a quartz powder feed vessel accommodating synthetic quartz powder 6 above the mold 1 in order to form an inner layer 4. A discharge pipe 93 equipped with a weighing feeder 92 is connected to the feed vessel 9. Agitating blades 91 are provided in the feed vessel 9. The top of the mold 1 is covered by a lid 71 with a slit opening 75 left uncovered. In order to form the inner layer, either of synthetic quartz powder and natural quartz powder may be used, but an example in which synthetic quartz powder 6 is used is shown in the figure.

After the base body 3 is completed or in the making of the base body 3, heating by discharge between carbon electrodes 51 and 52 gets started and is continued thereafter and in such a situation, synthetic quartz powder is fed into the interior of the base body 3 from the discharge pipe 93 while adjusting the weighing feeder 92 for feeding the synthetic quartz powder 6 at a degree of opening thereof. With the activation of the arc discharge apparatus 5, a high temperature gas atmosphere 8 is generated in the base body 3. Accordingly, the synthetic quartz powder is fed into the high temperature gas atmosphere 8.

Herein, the high temperature gas atmosphere means an atmosphere generated around carbon electrodes 51 and 52 by arc discharge using the electrodes 51 and 52 and a temperature of the atmosphere is as high as a temperature at which quartz glass is sufficiently molten, that is, two thousand and several hundred degrees.

The synthetic quartz powder fed into the high temperature gas atmosphere 8 is at least partly molten by heat of the high temperature gas atmosphere 8 and the powder is simultaneously dispersed toward the inner wall surface of the base body 3 to stick onto the inner wall surface of the base body 3. The powder thus stuck on the inner wall surface is further molten and forms a quartz glass layer having virtually no bubbles, that is an inner layer 4, on the inner surface of the base body 3 in an integral manner therewith. A formation method for the inner layer 4 is detailed in the above mentioned Japanese Patent Publication No. 4-22861.

Figure 6:
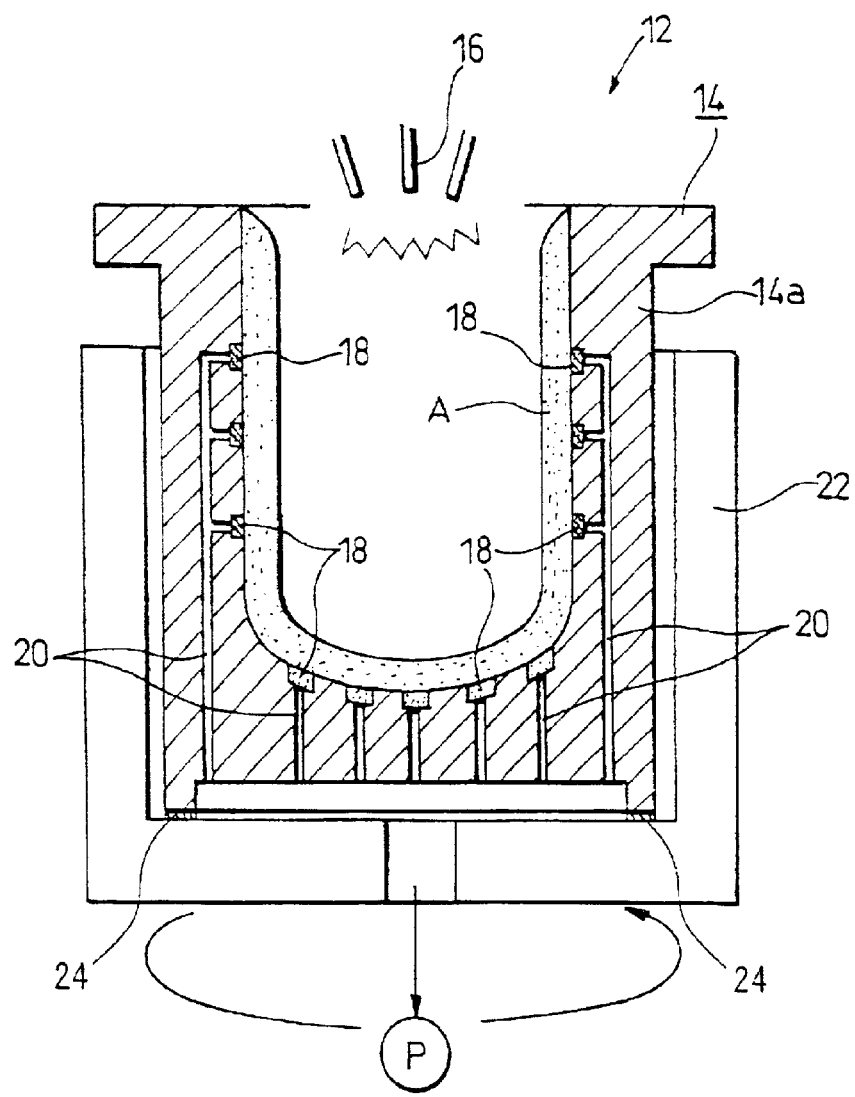
FIG. 6 is a longitudinal sectional view showing another embodiment of an apparatus used in carrying out a method of the present invention.
Figure 7:
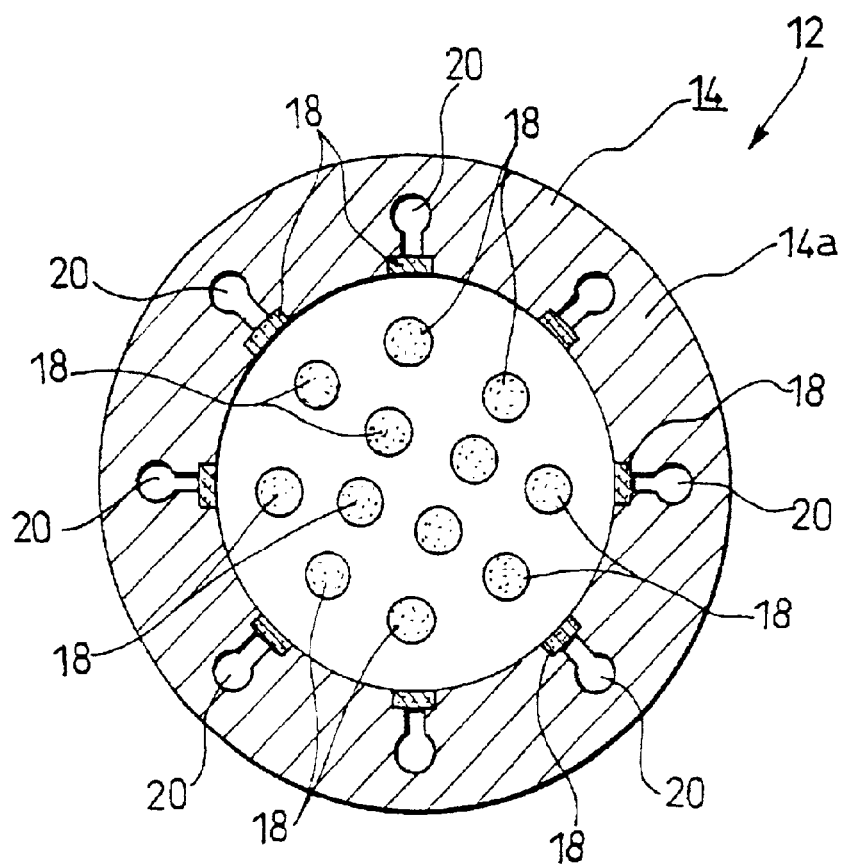
FIG. 7 is a cross sectional view illustrating the apparatus of FIG. 6.
Figure 8:
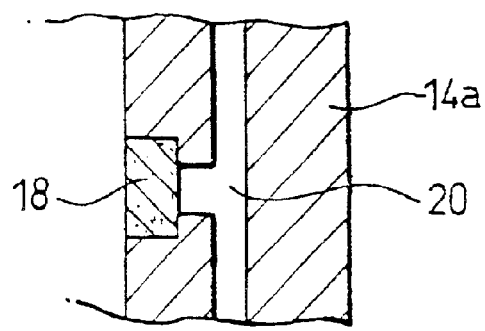
FIG. 8 is a partial sectional view showing a main part of the apparatus of FIG. 6.

Hereinafter, description will be made of another embodiment based on FIGS. 6 to 8. FIG. 6 is a longitudinal sectional view showing an embodiment of an apparatus used in carrying out a method of the present invention, FIG. 7 is a cross sectional view illustrating the apparatus of FIG. 6, and FIG. 8 is a partial sectional view showing a main part of the apparatus of FIG. 6. The embodiment is detailed in Japanese Patent Laid-open Publication No. 10-25184.

In the figures, numeral 12 indicates a production apparatus for a quartz glass crucible and is provided with a hollow mold 14 rotatable in a horizontal plane. The hollow mold 14 is made of carbonous material such as graphite. The hollow mold 14 is horizontally rotated by a means for rotation drive not shown. The hollow mold 14 is connected to a pressure reduction/evacuation means (P) such as a vacuum pump at the outer periphery thereof and thereby, the hollow mold 14 is evacuated to a reduced pressure at the outer periphery. Numeral 16 indicates a heating means for heating the inner surface of the hollow mold 14, for example an arc discharge means.

Numeral 18 indicates gas-permeability members and many of the members are arranged so as to open at the inner surface of the hollow mold 14 in uniform distribution across the inner surface. A way of effective distribution of the gas penetration members 18 is such that evacuation ranges in which the respective gas-permeability members 18 act are not overlapped with one another. The gas-permeability members 18 may be arranged in a matrix pattern at its intersections of rows and columns, but the arrangement in a zigzag pattern is preferred from the viewpoint of evacuation efficiency.

The gas-permeability members 18 are made of gas-permeability carbonous material such as graphite. Numeral 20 indicates evacuation paths that are bored through the bulk of a wall mass 14a of the hollow mold 14. An end of the evacuation path 20 is connected to a gas-permeability member 18 and the other end of the evacuation path 20 communicates with the outside at the outer side surface of the hollow mold 14.

(B) indicates a support frame provided at the outer side surface of the hollow mold 14. The support frame (B) supports the hollow mold 14 through a packing member (C) arranged on the inner bottom surface of the support frame (B).

When a quartz crucible is produced using the above described apparatus, first of all starting quartz powder is fed toward the inner side surface of the hollow mold 14 while rotating the hollow mold 14. The quartz powder is pressed onto the inner side surface of the hollow mold 14 by the action of a centrifugal force of the hollow mold 14 in rotation and thereby, a quartz powder layer (A) is formed by piling-up of the quartz powder along the inner side surface.

Then, the quartz powder layer (A) is molten by heating from the inner side surface by the heating means 16 such as an arc discharge means. In company with the heat melting, evacuation is conducted at the outer surface for example the outer bottom surface shown in the figures, of the hollow mold 14 by the pressure reduction/evacuation means (P) such as a vacuum pump in order to evacuate an inner gas in the quartz powder layer (A) through the gas-permeability members 18 and evacuation paths 20.

With the heat melting applied, the quartz powder layer (A) is molten up to positions in the vicinity of the outer surface from the inner side surface to obtain a green crucible almost in the shape of a crucible with a sintered outer surface.

In the embodiment shown in FIGS. 6 to 8, while there is shown the case where many of the gas-permeability members 18 are arranged as disc-like members independently positioned, rectangular members, square members, triangular members and others can be used and furthermore, many of annular or ring-like members that turn along its inner periphery of the hollow member 14 can be arranged.

Hereinafter, examples are taken up and concrete descriptions of the present invention will be made, but it is needless to say that the examples are provided for the illustrative purpose and should not be construed to restrict the scope of the present invention to the descriptions thereof.

EXAMPLE 1

A quartz glass crucible 22 inches in diameter was produced in accordance with the below described procedure using the apparatus shown in FIG. 1. Natural quartz glass powder in the range of 50 to 500 $\mu$m in particle diameter was fed into a mold (of a rotary type) 560 mm in inner diameter, rotating at 100 rpm, and piled up on the inner surface to a thickness of 30 mm in a uniform manner and then was not only the piled up quartz powder molten by heating from the interior of the mold by means of arc discharge but at the same time, synthetic quartz powder, which had a particle diameter in the range of 50 to 300 $\mu$m; an OH group concentration of 100 ppm; and a gas content of 30 $\mu$l/g, which had been quantified by means of a temperature programmed gas analysis from 0 up to 1000 degrees, was continuously fed from above at a feed rate of 100 g/min at a position spaced from the center of arc by a horizontal distance of 100 mm, under other conditions that the arc was held at a height of 500 mm above the inner surface of the bottom which was formed by melting; the arc was moved sideways in a horizontal plane from the central position of the mold; and an amount of arc heat was provided through the process at an electric power of 500 kw under conditions of a DC current of 2000 A and a voltage of 250 V, with the result that a transparent glass layer was formed across the entire inner surface to a thickness of 1 to 3 mm.

Figure 2:
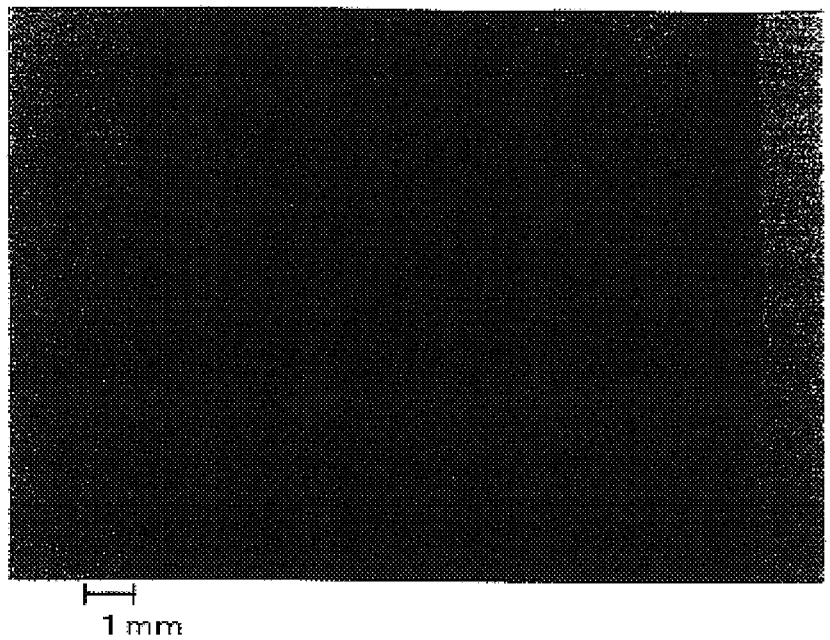
FIG. 2 is a microphotograph showing a sectional structure of an inner surface portion of a quartz glass crucible produced in Example 1.

After completion of the quartz glass crucible, a gas content in the transparent layer 1 mm in depth from the inner surface was measured by means of the temperature programmed gas analysis in the range of 0 to 1000 degrees and as a result, the gas content was measured to be equal to or less than 1 $\mu$l/g. Further, the maximum bubble diameter of a inner surface layer 1 mm in depth of the quartz glass crucible was equal to or less than 0.2 mm and a total bubble sectional area was measured to be equal to or less than 10%. In FIG. 2, there is shown a microphotograph of a sectional structure of a piece 1 mm in thickness sampled from a round portion of the quartz glass crucible produced in the example.

Figure 3:
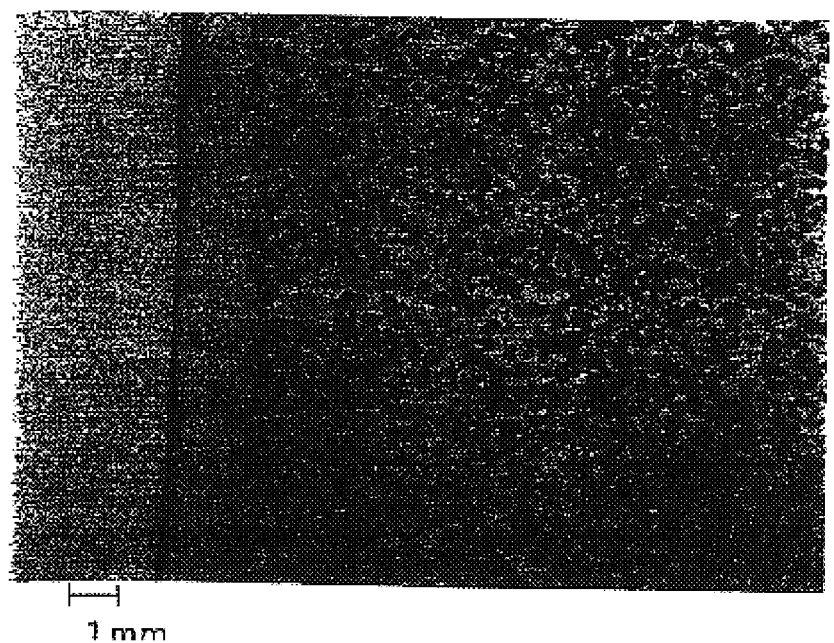
FIG. 3 is a microphotograph showing a sectional structure of an inner surface portion of a quartz glass crucible produced in Example 1 after a silicon single crystal is pulled up using the quartz glass crucible.

Another quartz glass crucible produced in the example was used to melt polysilicon charged therein and a silicon single crystal was pulled up in the passage of 100 hr under a degree of vacuum of 20 mmb and the silicon single crystal was pulled up with crystal-defect free across its full length. The transparent layer of the inner surface of the quartz glass crucible after use was observed and no bubbles equal to or more than 0.5 mm in diameter were found in a layer 1 mm in depth from the inner surface and a total bubble sectional area was equal to or less than 40% in the layer. A piece 1 mm in thickness was sampled from a round portion of the quartz glass crucible after use and a microscopic photograph of a sectional structure thereof was taken, which is shown in FIG. 3.

EXAMPLE 2

A quartz glass crucible 22 inches in diameter was produced in accordance with the below described procedure using the apparatus shown in FIG. 1. Natural quartz glass powder in the range of 50 to 500 μm in particle diameter was fed into a mold (of a rotary type) 560 mm in inner diameter, rotating at 100 rpm, and piled up onto the inner surface to a thickness of 30 mm in a uniform manner and then not only was the piled up quartz powder molten by heating from the interior of the mold by means of arc discharge but at the same time, synthetic quartz glass powder, which had a particle diameter in the range of 50 to 300 μm; an OH group concentration of 5 ppm; and a gas content of 5 μl/g including $CO$, $CO_2$ and $CH_4$ of a total 2% by volume, which had been quantified by means of a temperature programmed gas analysis from 0 up to 1000 degrees, was continuously fed from above at a feed rate of 100 g/min at a position spaced from the center of arc by a horizontal distance of 100 mm, under other conditions that the arc was held at a height of 500 mm above the inner surface of the bottom which was formed by melting; the arc was moved sideways in a horizontal plane from the central position of the mold; and an amount of arc heat was provided through the process at an electric power of 300 kw under conditions of a DC current of 1500 A and a voltage of 200 V, with the result that a transparent glass layer was formed across the entire inner surface to a thickness of 1 to 3 mm.

After completion of the quartz glass crucible, a gas content in the transparent layer 1 mm in depth from the inner surface was measured by means of the temperature programmed gas analysis in the range of 0 to 1000 degrees and as a result, the gas content was measured to be equal to or less than 1 μl/g. Further, the maximum bubble diameter of a inner surface layer 1 mm in depth of the quartz glass crucible was equal to or less than 0.2 mm, a total bubble sectional area was measured to be equal to or less than 10% and $CO$, $CO_2$ and $CH_4$ of a total 2% by volume was included in bubbles. A sectional structure of a piece 1 mm in thickness sampled from a round portion of the quartz glass crucible produced in the example, which was similar to that of FIG. 2.

Another quartz glass crucible produced in the example was used to melt polysilicon charged therein and a silicon single crystal was pulled up in the passage of 100 hr under a degree of vacuum of 20 mmb and the silicon single crystal was pulled up with crystal-defect free across its full length. The transparent layer of the inner surface of the quartz glass crucible after use was observed and no bubbles equal to or more than 0.5 mm were found in a layer 1 mm in depth from the inner surface and a total bubble sectional area was equal to or less than 40%. A piece 1 mm in thickness was sampled from a round portion of the quartz glass crucible after use and a microphotograph of a sectional structure thereof was taken, which is similar to that of FIG. 3 .

EXAMPLE 3

A quartz glass crucible 30 inches in diameter was produced in accordance with the below described procedure using the apparatus shown in FIG. 1. Natural quartz glass powder in the range of 50 to 500 μm in particle diameter was fed into a mold (of a rotary type) 780 mm in inner diameter, rotating at 100 rpm, and piled up onto the inner surface to a thickness of 35 mm in a uniform manner and then not only was the piled up quartz powder molten by heating from the interior of the mold by means of arc discharge but at the same time, synthetic quartz powder, which had a particle diameter in the range of 50 to 300 μm; an OH group concentration of 100 ppm; and a gas content of 30 μl/g, which had been quantified by means of a temperature programmed gas analysis from 0 up to 1000 degrees, was continuously fed from above at a feed rate of 100 g/min at a position spaced from the center of arc by a horizontal distance of 100 mm, under other conditions that the arc was held at a height of 500 mm above the inner surface of the bottom which was formed by melting; the arc was moved sideways in a horizontal plane from the central position of the mold; and an amount of arc heat was provided through the process at an electric power of 750 kw under conditions of a DC current of 3000 A and a voltage of 250 V, with the result that a transparent glass layer was formed across the entire inner surface to a thickness of 1 to 3 mm.

After completion of the quartz glass crucible, a gas content in the transparent layer 1 mm in depth from the inner surface was measured by means of the temperature programmed gas analysis in the range of 0 to 1000 degrees and as a result, the gas content was measured to be equal to or less than 1 μl/g. Further, the maximum bubble diameter of a inner surface layer 1 mm in depth of the quartz glass crucible was equal to or less than 0.2 mm and a total bubble sectional area was measured to be equal to or less than 10%. A sectional structure of a piece 1 mm in thickness sampled from a round portion of the quartz glass crucible produced in the example was similar to that of FIG. 2.

Another quartz glass crucible produced in the example was used to melt polysilicon charged therein and a silicon single crystal was pulled up in the passage of 100 hr under a degree of vacuum of 20 mmb and the silicon single crystal was pulled up with crystal-defect free across its full length. The transparent layer of the inner surface of the quartz glass crucible after use was observed and no bubbles equal to or more than 0.5 mm were found in a layer 1 mm in depth from the inner surface and a total bubble sectional area was equal to or less than 40%. A piece 1 mm in thickness was sampled from a round portion of the quartz glass crucible after use and a microphotograph of a sectional structure thereof was taken, which is similar to that of FIG. 3.

COMPARATIVE EXAMPLE 1

A quartz glass crucible 22 inches in diameter was produced in accordance with the below described procedure using the apparatus shown in FIG. 1. Natural quartz glass powder in the range of 50 to 500 μm in particle diameter was fed into a mold (of a rotary type) 560 mm in inner diameter, rotating at 100 rpm, and piled up on the inner surface to a thickness of 30 mm in a uniform manner and then not only was the piled up quartz powder molten by heating from the interior of the mold by means of arc discharge but at the same time, synthetic quartz powder, which had a particle diameter in the range of 50 to 300 μm; an OH group concentration of 100 ppm; a gas content of 30 μl/g including $CO$, $CO_2$ and $CH_4$ of a total 25% by volume, which had been quantified by means of a temperature programmed gas analysis from 0 up to 1000 degrees, was continuously fed from above at a feed rate of 100 g/min at a position spaced from the center of arc by a horizontal distance of 100 mm, under other conditions that the arc was held at a height of 500 mm above the inner surface of the bottom which was formed by melting; the arc was moved sideways in a horizontal plane from the central position of the mold; and an amount of arc heat was provided through the process at an electric power of 300 kw under conditions of a DC current of 1500 A and a voltage of 200 V, with the result that a transparent glass layer was formed across the entire inner surface to a thickness of 1 to 3 mm.

Figure 4:
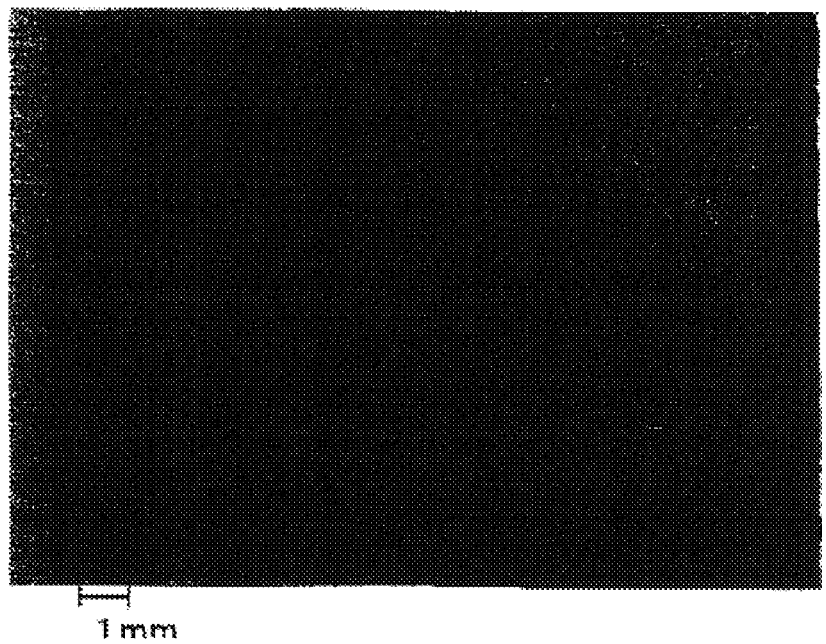
FIG. 4 is a microphotograph showing a sectional structure of an inner surface portion of a quartz glass crucible produced in Comparative Example 1.

After completion of the quartz glass crucible, a gas content in the transparent layer 1 mm in depth from the inner surface was measured by means of the temperature programmed gas analysis in the range of 0 to 1000 degrees and as a result, the gas content was measured to be equal to or less than 3 µl/g. Further, the maximum bubble diameter of a inner surface layer 1 mm in depth of the quartz glass crucible was equal to or less than 0.3 mm, a total bubble sectional area was measured to be equal to or less than 20% and $CO$, $CO_2$ and $CH_4$ of a total 25% by volume was included in bubbles. A microphotograph of a sectional structure of a piece 1 mm in thickness sampled from a round portion of the quartz glass crucible produced in the example is shown in FIG. 4.

Figure 5:
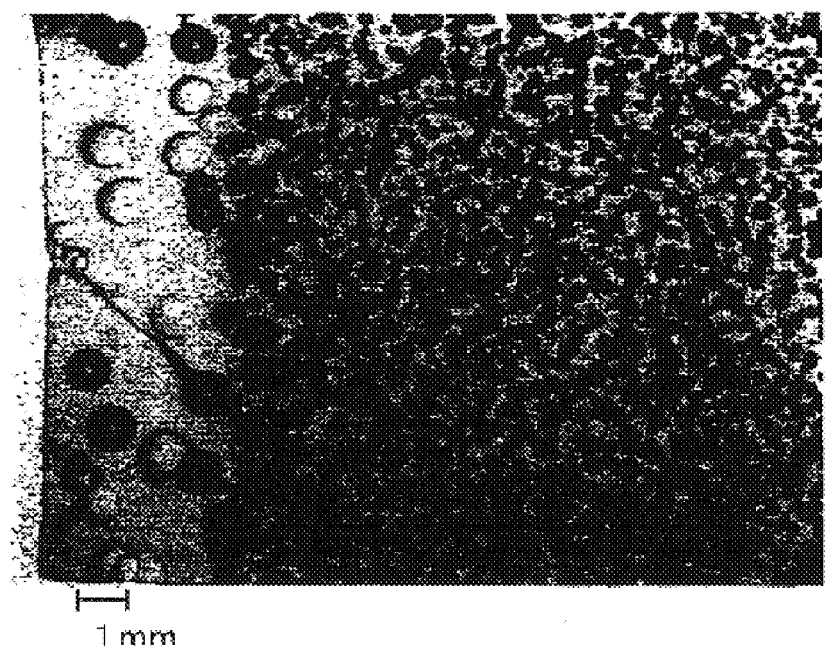
FIG. 5 is a microphotograph showing a sectional structure of an inner surface portion of a quartz glass crucible produced in Comparative Example 1 after a silicon single crystal is pulled up using the quartz glass crucible.

Another quartz glass crucible produced in the example was used to melt polysilicon charged therein and a silicon single crystal was pulled up in the passage of 100 hr under a degree of vacuum of 20 mmb and the silicon single crystal went into a disorder in the course of pulling up. The transparent layer of the inner surface of the quartz glass crucible after use was observed and many bubbles of 0.8 mm were found in a layer 0.5 mm in depth from the inner surface with some bubbles having burst after reaching the inner surface from inside during the pulling up and a total bubble sectional area was 60%. A piece 1 mm in thickness was sampled from a round portion of the quartz glass crucible after use and a microphotograph of a sectional structure was taken, which is shown in FIG. 5.

As is clear from the results of Examples 1 to 3, the following facts were found. When no expanded bubbles equal to or more than 0.5 mm in diameter were present in a layer 1 mm in depth from the inner surface of a quartz glass crucibles after a silicon single crystal was pulled up using the crucible, the silicon single crystal was able to be pulled up along its full length with crystal-defect free. However, as shown in Comparative Example 1, when expanded bubbles equal to or more than 0.5 mm in diameter were present in a layer 1 mm in depth from the inner surface of a quartz glass crucible, a silicon single crystal went into a disorder in the course of pulling up.

Further, in the above cases, the following facts were found. When a total bubble sectional area in a layer 1 mm in depth from the inner surface of a quartz glass crucible was equal to or less than 40%, a silicon single crystal was able to be pulled up along its full length with crystal-defect free (Examples 1 to 3). However, when a total bubble sectional area in a layer 1 mm in depth from the inner surface of a quartz glass crucible was beyond 40% (60% in Comparative Example 1), a silicon single crystal went into a disorder in the course of pulling up.

In addition, as shown in Examples 1 to 3, the following facts were found. When, in a layer 1 mm in depth from the inner surface of a quartz glass crucible as produced, a gas content was equal to or less than 1 µl/g, the maximum bubble diameter was equal to or less than 0.2 mm and a total bubble sectional area was equal to or less than 20%, no expanded bubbles equal to or more than 0.5 mm were present in a layer 1 mm in depth from the inner surface of the quartz glass crucible after a silicon single crystal was pulled up using the quartz glass crucible and a total bubble sectional area was able to be made to be equal to or less than 40% in the layer 1 mm in depth. However, in Comparative Example 1, when the above described conditions were not met as shown, (in Comparative Example 1, a gas content was equal to or less than 3 µl/g and the maximum bubble diameter was 0.3 mm), bubbles equal to or more than 0.5 mm in diameter were present in a layer 1 mm in depth from the inner surface of a quartz glass crucible after a silicon single crystal was pulled up using the quartz glass crucible and a total bubble sectional area was beyond 40% in the layer 1 mm in depth.

As shown in Example 1, when a quartz glass crucible 22 inches in diameter is produced under the following conditions using an arc rotation melting method, the produced quartz glass crucible can have a performance according to the present invention: synthetic quartz powder has a gas content equal to or less than 30 µl/g (30 µl/g in Example 1) and an OH group concentration equal to or less than 300 ppm (100 ppm in Example 1); a heat melting power is in the range of 400 kw to 1000 kw (500 kw in Example 1); a horizontal distance from the arc center to the falling position of the synthetic quartz glass powder is in the range of 50 to 300 mm (100 mm in Example 1); a distance from the arc center to an inner surface of piled-up powder on a bottom of the base body is equal to or less than 800 mm (500 mm in Example 1), a particle diameter of synthetic quartz glass powder is equal to or less than 300 µm (50 µm to 300 µm in Example 1), and a feed rate of the synthetic quartz glass powder is equal to or less than 200 g/min (100 g/min in Example 1).

As shown in Example 2, when a quartz glass crucible 22 inches in diameter is produced under the following conditions using an arc rotation melting method, the produced quartz glass crucible can have a performance according to the present invention: synthetic quartz powder has a gas content in the range of 3 to 20 µl/g (3 µl/g in Example 2) and an OH group concentration equal to or less than 200 ppm (5 ppm in Example 2); a heat melting power is in the range of 200 kw to 400 kw (300 kw in Example 2), a horizontal distance from the arc center to the falling position of the synthetic quartz glass powder is in the range of 50 to 300 mm (100 mm in Example 2), a distance from the arc center to an inner surface of piled-up powder on a bottom of the base body is equal to or less than 800 mm (500 mm in Example 2), a particle diameter of the synthetic quartz glass powder is equal to or less than 300 µm (50 µm to 300 µm in Example 2), and a feed rate of the synthetic quartz glass powder is equal to or less than 200 g/min (100 g/min in Example 2).

As shown in Example 3, when a quartz glass crucible 30 inches in diameter is produced under the following conditions using an arc rotation melting method, the produced quartz glass crucible can have a performance according to the present invention: synthetic quartz powder has a gas content equal to or less than 30 µl/g (30 µl/g in Example 3) and an OH group concentration equal to or less than 300 ppm (100 ppm in Example 2), a heat melting power is in the range of 600 kw to 2000 kw (750 kw in Example 3), a horizontal distance from the arc center to the falling position of the synthetic quartz glass powder is in the range of 50 to 300 mm (100 mm in Example 3), a distance from the arc center to an inner surface of piled-up powder on a bottom of the base body is equal to or less than 800 mm (500 mm in Example 2), a particle diameter of the synthetic quartz glass powder is equal to or less than 300 µm (50 µm to 300 µm in Example 2), and a feed rate of the synthetic quartz glass powder is equal to or less than 200 g/min (100 g/min in Example 2).

While in Examples 1 to 3, there are shown the examples in which the apparatus shown in FIG. 1 is used to produce quartz glass crucibles under a normal pressure condition, production of a quartz glass crucible can also be performed under a reduced pressure condition using the apparatus shown in FIGS. 6 to 8. Experiments were conducted in conditions similar to those of Examples 1 to 3 with the exception that the interior of a mold was held at a vacuum degree of 500 mm Hg and a result similar to those of Examples 1 to 3 was able to be obtained.

Further, it was confirmed that while, in Examples 1 to 3, the examples in which, as quartz glass powder that forms the inner layer, synthetic quartz glass powder was employed were shown, even when natural quartz glass powder was used instead of synthetic quartz glass powder, a result similar to those of Examples 1 to 3 was obtained.

Capability of Exploitation in Industry

To sum up, a quartz glass crucible for pulling up a silicon single crystal of the present invention exerts a great effect that a silicon single crystal can be pulled up with crystal-defect free across its full length, thus enabling a single crystallization ratio to be greatly improved.

Further, according to a production method for a quartz glass crucible for pulling up a silicon single crystal of the present invention, an effect can be exerted that a quartz glass crucible having an excellent performance of the present invention can be stably produced with no complex process.

What is claimed is:

1. A quartz glass crucible for pulling up a silicon single crystal, comprising a crucible base body constituted of a semi-transparent quartz glass layer and a transparent quartz glass layer formed on an inner wall surface of the crucible base body, characterized in that no expanded bubbles equal to or more than 0.5 mm in diameter are present in a layer 1 mm in depth from an inner surface of the quartz glass crucible after the silicon single crystal is pulled up using the quartz glass crucible, wherein, with an arc rotation melting method, the base body is prepared in a mold using silicon dioxide powder and an inner layer is formed on an inner surface of the base body using silicon dioxide powder under conditions that the silicon dioxide powder has a gas content equal to or less than 30 $\mu$l/g and an OH group concentration equal to or less than 300 ppm, a heat melting power is applied in the range of 400 to 1000 kw, a horizontal distance from an arc center to a falling position of the silicon dioxide powder is in the range of 50 to 300 mm, a distance from the arc center to an inner surface of piled-up powder on a bottom of the base body is equal to or less than 800 mm, a particle diameter of the silicon dioxide powder is equal to or less than 300 $\mu$m, and a feed rate of the silicon dioxide powder is equal to or less than 200 g/min.

2. A quartz glass crucible for pulling up a silicon single crystal, comprising a crucible body constituted of a semi-transparent quartz glass layer and a transparent quartz glass layer formed on an inner wall surface of the crucible base body, characterized in that no expanded bubbles equal to or more than 0.5 mm in diameter are present in a layer 1 mm in depth from an inner surface of the quartz glass crucible after the silicon single crystal is pulled up using the quartz glass crucible, wherein, with an arc rotation melting method, the base body is prepared in a mold using silicon dioxide powder and an inner layer is formed on an inner surface of the base body using silicon dioxide powder under conditions that the silicon dioxide powder has a gas content equal to or less than 20 $\mu$l/g and an OH group concentration equal to or less than 300 ppm, a heat melting power is applied in the range of 200 to 400 kw, a horizontal distance from an arc center to a falling position of the silicon dioxide powder is in the range of 50 to 300 mm, a distance from the arc center to an inner surface of piled-up powder on a bottom of the base body is equal to or less than 800 mm, a particle diameter of the silicon dioxide powder is equal to or less than 300 $\mu$m, and a feed rate of the silicon dioxide powder is equal to or less than 200 g/min.

3. A quartz glass crucible for pulling up a silicon single crystal, comprising a crucible body constituted of a semi-transparent quartz glass layer and a transparent quartz glass layer formed on an inner wall surface of the crucible base body, characterized in that no expanded bubbles equal to or more than 0.5 mm in diameter are present in a layer 1 mm in depth from an inner surface of the quartz glass crucible after the silicon single crystal is pulled up using the quartz glass crucible, wherein, with an arc rotation melting method, the base body is prepared in a mold using silicon dioxide powder and an inner layer is formed on an inner surface of the base body using silicon dioxide powder under conditions that the silicon dioxide powder has a gas content equal to or less than 30 $\mu$l/g and an OH group concentration equal to or less than 300 ppm, a heat melting power is applied in the range of 600 to 2000 kw, a horizontal distance from an arc center to a falling position of the silicon dioxide powder is in the range of 50 to 300 mm, a distance from the arc center to an inner surface of piled-up powder on a bottom of the base body is equal to or less than 1500 mm, a particle diameter of the silicon dioxide powder is equal to or less than 300 $\mu$m, and a feed rate of the silicon dioxide powder is equal to or less than 200 g/min.

4. A quartz glass crucible for pulling up a silicon single crystal according to any of claim 1, 2, or 3, wherein, in the transparent quartz glass layer before the silicon single crystal is pulled up, the maximum of diameters of bubbles is equal to or less than 0.2 mm, a total sectional area of bubbles is equal to or less than 20% and a gas content is equal to or less than 1 $\mu$l/g.

5. A quartz glass crucible for pulling up a silicon single crystal according to claim 4, having a diameter in the range of 22 to 28 inches, wherein, with an arc rotation melting method, the base body is prepared in a mold using silicon dioxide powder and an inner layer is formed on an inner surface of the base body using silicon dioxide powder under conditions that the silicon dioxide powder has a gas content equal to or less than 30 $\mu$l/g and an OH group concentration equal to or less than 300 ppm, a heat melting power is applied in the range of 400 to 1000 kw, a horizontal distance from an arc center to a falling position of the silicon dioxide powder is in the range of 50 to 300 mm, a distance from the arc center to an inner surface of piled-up powder on a bottom of the base body is equal to or less than 800 mm, a particle diameter of the silicon dioxide powder is equal to or less than 300 $\mu$m, and a feed rate of the silicon dioxide powder is equal to or less than 200 g/min.

6. A quartz glass crucible for pulling up a silicon single crystal according to claim 4, having a diameter in the range of 22 to 28 inches, wherein, with an arc rotation melting method, the base body is prepared in a mold using silicon dioxide powder and an inner layer is formed on an inner surface of the base body using silicon dioxide powder under conditions that the silicon dioxide powder has a gas content equal to or less than 20 $\mu$l/g and an OH group concentration equal to or less than 300 ppm, a heat melting power is applied in the range of 200 to 400 kw, a horizontal distance from an arc center to a falling position of the silicon dioxide powder is in the range of 50 to 300 mm, a distance from the arc center to an inner surface of piled-up powder on a bottom of the base body is equal to or less than 800 mm, a particle diameter of the silicon dioxide powder is equal to or less than 300 $\mu$m, and a feed rate of the silicon dioxide powder is equal to or less than 200 g/min.

7. A quartz glass crucible for pulling up a silicon single crystal according to claim 4, having a diameter in the range of 30 to 48 inches, wherein, with an arc rotation melting method, the base body is prepared in a mold using silicon dioxide powder and an inner layer is formed on an inner surface of the base body using silicon dioxide powder under conditions that the silicon dioxide powder has a gas content equal to or less than 30 μl/g and an OH group concentration equal to or less than 300 ppm, a heat melting power is applied in the range of 600 to 2000 kw, a horizontal distance from an arc center to a falling position of the silicon dioxide powder is in the range of 50 to 300 mm, a distance from the arc center to an inner surface of piled-up powder on a bottom of the base body is equal to or less than 1500 mm, a particle diameter of the silicon dioxide powder is equal to or less than 300 μm, and a feed rate of the silicon dioxide powder is equal to or less than 200 g/min.

8. A quartz glass crucible for pulling up a silicon single crystal according to claim 4, having a diameter in the range of 22 to 28 inches, wherein, with an arc rotation melting method, the base body is prepared in a mold using silicon dioxide powder and an inner layer is formed on an inner surface of the base body using silicon dioxide powder under conditions that the silicon dioxide powder has a gas content equal to or less than 30 μl/g and an OH group concentration equal to or less than 300 ppm, a heat melting power is applied in the range of 400 to 1000 kw, a horizontal distance from an arc center to a falling position of the silicon dioxide powder is in the range of 50 to 300 mm, a distance from the arc center to an inner surface of piled-up powder on a bottom of the base body is equal to or less than 800 mm, a particle diameter of the silicon dioxide powder is equal to or less than 300 μm, and a feed rate of the silicon dioxide powder is equal to or less than 200 g/min, and the powder layers in the mold are prepared under a reduced pressure by evacuating from an inside of the mold.

9. A quartz glass crucible for pulling up a silicon single crystal according to claim 4, having a diameter in the range of 22 to 28 inches, wherein, with an arc rotation melting method, the base body is prepared in a mold using silicon dioxide powder and an inner layer is formed on an inner surface of the base body using silicon dioxide powder under conditions that the silicon dioxide powder has a gas content equal to or less than 20 μl/g and an OH group concentration equal to or less than 300 ppm, a heat melting power is applied in the range of 200 to 400 kw, a horizontal distance from an arc center to a falling position of the silicon dioxide powder is in the range of 50 to 300 mm, a distance from the arc center to an inner surface of piled-up powder on a bottom of the base body is equal to or less than 800 mm, a particle diameter of the silicon dioxide powder is equal to or less than 300 μm, and a feed rate of the silicon dioxide powder is equal to or less than 200 g/min, and the powder layers in the mold are prepared under a reduced pressure by evacuating from an inside of the mold.

10. A quartz glass crucible for pulling up a silicon single crystal according to claim 4, having a diameter in the range of 30 to 48 inches, wherein, with an arc rotation melting method, the base body is prepared in a mold using silicon dioxide powder and an inner layer is formed on an inner surface of the base body using silicon dioxide powder under conditions that the silicon dioxide powder has a gas content equal to or less than 30 μl/g and an OH group concentration equal to or less than 300 ppm, a heat melting power is applied in the range of 600 to 2000 kw, a horizontal distance from an arc center to a falling position of the silicon dioxide powder is in the range of 50 to 300 mm, a distance from the arc center to an inner surface of piled-up powder on a bottom of the base body is equal to or less than 1500 mm, a particle diameter of the silicon dioxide powder is equal to or less than 300 μm, and a feed rate of the silicon dioxide powder is equal to or less than 200 g/min, and the powder layers in the mold are prepared under a reduced pressure by evacuating from an inside of the mold.

11. A quartz glass crucible for pulling up a silicon single crystal according to claim 8, wherein the reduced pressure is in the range of 10 to 700 mm Hg.

12. A quartz glass crucible for pulling up a silicon single crystal according to claim 9, wherein the reduced pressure is in the range of 10 to 700 mm Hg.

13. A quartz glass crucible for pulling up a silicon single crystal according to claim 10, wherein the reduced pressure is in the range of 10 to 700 mm Hg.

14. A production method for a quartz glass crucible for pulling up a silicon single crystal, the quartz glass crucible having a diameter in the range of 22 to 28 inches, characterized in that, with an arc rotation melting method, a base body is prepared in a mold using silicon dioxide powder and an inner layer is formed on an inner surface of the base body using silicon dioxide powder under conditions that the silicon dioxide powder has a gas content equal to or less than 30 μl/g and an OH group concentration equal to or less than 300 ppm, a heat melting power is applied in the range of 400 to 1000 kw, a horizontal distance from an arc center to a falling position of the silicon dioxide powder is in the range of 50 to 300 mm, a distance from the arc center to an inner surface of piled-up powder on a bottom of the base body is equal to or less than 800 mm, a particle diameter of the silicon dioxide powder is equal to or less than 300 μm, and a feed rate of the silicon dioxide powder is equal to or less than 200 g/min.

15. A production method for a quartz glass crucible for pulling up a silicon single crystal, the quartz glass crucible having a diameter in the range of 22 to 28 inches, characterized in that, with an arc rotation melting method, a base body is prepared in a mold using silicon dioxide powder and an inner layer is formed on an inner surface of the base body using silicon dioxide powder under conditions that the silicon dioxide powder has a gas content equal to or less than 20 μl/g and an OH group concentration equal to or less than 300 ppm, a heat melting power is applied in the range of 200 to 400 kw, a horizontal distance from an arc center to a falling position of the silicon dioxide powder is in the range of 50 to 300 mm, a distance from the arc center to an inner surface of piled-up powder on a bottom of the base body is equal to or less than 800 mm, a particle diameter of the silicon dioxide powder is equal to or less than 300 μm, and a feed rate of the silicon dioxide powder is equal to or less than 200 g/min.

16. A production method for a quartz glass crucible for pulling up a silicon single crystal, the quartz glass crucible having a diameter in the range of 30 to 48 inches, characterized in that, with an arc rotation melting method, a base body is prepared in a mold using silicon dioxide powder and an inner layer is formed on an inner surface of the base body using silicon dioxide powder under conditions that the silicon dioxide powder has a gas content equal to or less than 30 μl/g and an OH group concentration equal to or less than 300 ppm, a heat melting power is applied in the range of 600 to 2000 kw, a horizontal distance from an arc center to a falling position of the silicon dioxide powder is in the range of 50 to 300 mm, a distance from the arc center to an inner surface of piled-up powder on a bottom of the base body is equal to or less than 1500 mm, a particle diameter of the silicon dioxide powder is equal to or less than 300 μm, and a feed rate of the silicon dioxide powder is equal to or less than 200 g/min.

17. A production method for a quartz glass crucible for pulling up a silicon single crystal according to any of the claim 14, 15, or 16, wherein the powder layers in the mold are prepared under a reduced pressure by evacuating from an inside of the mold.

18. A production method for a quartz glass crucible for pulling up a silicon single crystal according to claim 17, wherein the reduced pressure is in the range of 10 to 700 mm Hg.

* * * * *